United States Patent
Bagul

(10) Patent No.: US 8,558,550 B2
(45) Date of Patent: Oct. 15, 2013

(54) MONITORING OF POWER SWITCHING MODULES

(75) Inventor: Mandar C. Bagul, Maharashtra (IN)

(73) Assignee: Vetco Gray Controls Limited, Nailsea, Bristol (GB)

( * ) Notice: Subject to any disclaimer, the term of this patent is extended or adjusted under 35 U.S.C. 154(b) by 387 days.

(21) Appl. No.: 12/941,118

(22) Filed: Nov. 8, 2010

(65) Prior Publication Data

US 2011/0128064 A1   Jun. 2, 2011

(30) Foreign Application Priority Data

Nov. 27, 2009 (GB) .................................. 0920802.6

(51) Int. Cl.
*G01R 31/08* (2006.01)

(52) U.S. Cl.
USPC .......................................... 324/522; 324/531

(58) Field of Classification Search
None
See application file for complete search history.

(56) References Cited

U.S. PATENT DOCUMENTS

| | | | |
|---|---|---|---|
| 5,637,933 A | 6/1997 | Rawlings et al. | |
| 5,875,088 A * | 2/1999 | Matsko et al. | 361/96 |
| 6,828,695 B1 | 12/2004 | Hansen et al. | |
| 6,892,115 B2 | 5/2005 | Berkan et al. | |
| 7,012,421 B2 * | 3/2006 | Lavoie et al. | 324/142 |
| 7,262,943 B2 * | 8/2007 | Stellato et al. | 361/62 |
| 2004/0075343 A1 | 4/2004 | Wareham et al. | |

FOREIGN PATENT DOCUMENTS

| | | |
|---|---|---|
| GB | 2405163 A | 2/2005 |
| WO | 0171886 A1 | 9/2001 |

OTHER PUBLICATIONS

Search Report, dated Feb. 19, 2010.

* cited by examiner

*Primary Examiner* — Minh N Tang
(74) *Attorney, Agent, or Firm* — Global Patent Operation

(57) ABSTRACT

A method of monitoring an electrical power switching module of an underwater installation, the power switching module being operable to switch AC power in use is provided. The method includes the steps of measuring at least one operating parameter of the power switching module and producing a signal indicative of the measured parameter; if the signal is not digital, then converting the signal into a digital format; and outputting the digital signal on a bus. A power distribution unit for an underwater installation is also provided.

13 Claims, 2 Drawing Sheets

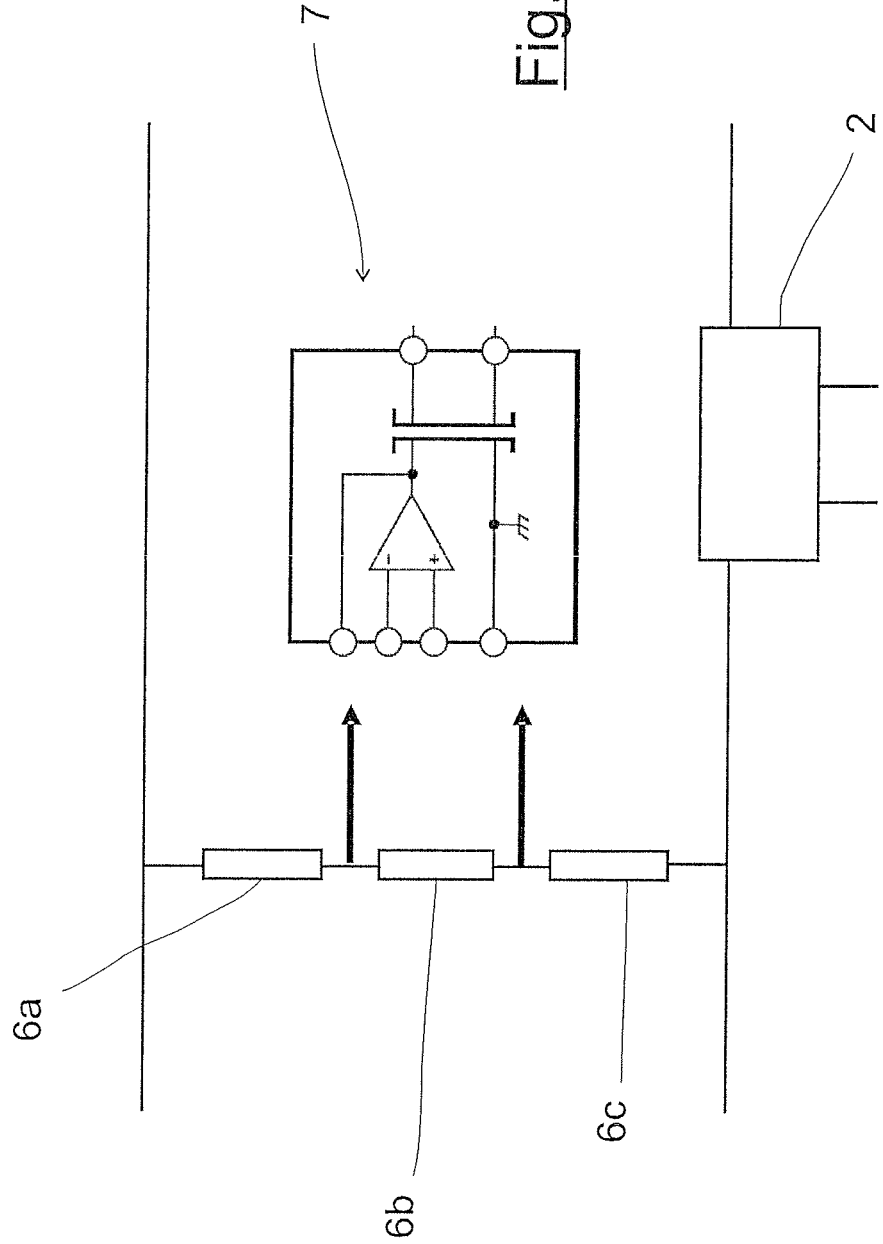

MONITORING OF POWER SWITCHING MODULES

BACKGROUND OF THE INVENTION

1. Field of the Invention

The present invention relates to a method of monitoring an electrical power switching module of an underwater installation and a power distribution unit for an underwater installation.

2. Description of Related Art

Underwater facilities, for example subsea well installations such as hydrocarbon production wells, are typically supplied with AC electrical power from the surface via an umbilical cable. At the subsea end, the umbilical terminates in an umbilical termination unit ("UTA"). Switching of this electric power between the various well functions, (including for example a subsea electronic module ("SEM") of a subsea control module ("SCM"), which may for example be mounted on a well tree), is regulated by a number of power switching modules ("PSM"), typically housed within a power distribution and protection module ("PD&PM"), which is in turn part of a subsea distribution unit. Each PSM is typically a silicon controlled rectifier-based AC power static switch, as is known in the art.

A drawback with such systems is that well operators are unable to determine whether the PSMs are functioning correctly, or to diagnose a PSM failure.

BRIEF SUMMARY OF THE INVENTION

It is an aim of the present invention to overcome this problem. This aim is achieved by providing telemetry functions such that various operating parameters, for example incoming voltage, load current, device and environment temperatures and the output switched voltage may be measured, converted to digital telemetry messages and relayed to operators at the surface. From these messages, the health and integrity of the PSMs may be determined.

In accordance with a first aspect of the invention there is provided a method of monitoring an electrical power switching module of an underwater installation, the power switching module being operable to switch AC power in use, comprising the steps of measuring at least one operating parameter of the power switching module and producing a signal indicative of the measured parameter, if the signal is not digital, then converting the signal into a digital format, and outputting the digital signal on a bus. Outputting the digital signal on a bus could comprise outputting the signal on an inter-integrated circuit ($I^2C$) bus.

The method could further comprise the step of transmitting the output digital signal to a remote location using Transmission Control Protocol/Internet Control Protocol (TCP/IP). In this case the digital signal could be transmitted to the remote location using the Ethernet protocol.

The operating parameter could comprise the input voltage to the power switching module and/or the output voltage from the power switching module. In this case, in step a) the voltage could be scaled down using a resistance network. While measuring at least one operating parameter of the power switching module and producing a signal indicative of the measured parameter, the voltage output from the resistance network could be fed to an isolation amplifier.

The operating parameter could comprise the load current across the power switching module. In this case, the current could be determined using a Hall Effect transducer.

The operating parameter could comprise the temperature of the power switching module and/or the ambient temperature around the power switching module.

The power switching module could be housed within a power distribution and protection module.

In accordance with a second aspect of the present invention there is provided a power distribution unit for an underwater installation having an input adapted to receive AC power and an output adapted for outputting AC power, the unit comprising an electrical power switching module connected between the input and the output and being operable to switch AC power in use, wherein the unit further comprises measuring means for measuring an operating parameter of said power switching module and producing an output signal indicative of said measured parameter, an analogue to digital converter for converting the signal indicative of the measured parameter to a digital signal, and a bus for outputting the digital signal. The bus could be an $I^2C$ bus.

The power distribution unit could comprise format conversion means for converting the output digital signal into TCP/IP format. In this case, the unit could comprise interfacing means for passing the converted signal onto a TCP/IP network, for example the signal being converted according to the Ethernet protocol.

The unit could comprise additional measuring means for measuring additional respective operating parameters of said power switching module and producing respective output signals, and wherein each said output signal is output by the bus.

The operating parameter could comprise the input AC voltage to the power switching module and/or the output AC voltage from the power switching module. In this case, the power distribution unit could comprise a resistance network connected to the AC connection to scale down the voltage, the unit comprising for example an isolation amplifier connected to the resistance network to receive voltage therefrom.

The operating parameter could comprise the load current across the power switching module. In this case the power distribution unit could comprise a Hall Effect transducer to determine the load current.

The operating parameter could comprise the temperature of the power switching module and/or the ambient temperature of the unit.

BRIEF DESCRIPTION OF THE DRAWINGS

The invention will now be described with reference to the accompanying figures, of which:

FIG. 2 schematically shows the AC voltage monitoring means of FIG. 1.

DETAILED DESCRIPTION OF THE INVENTION

Figure 1:
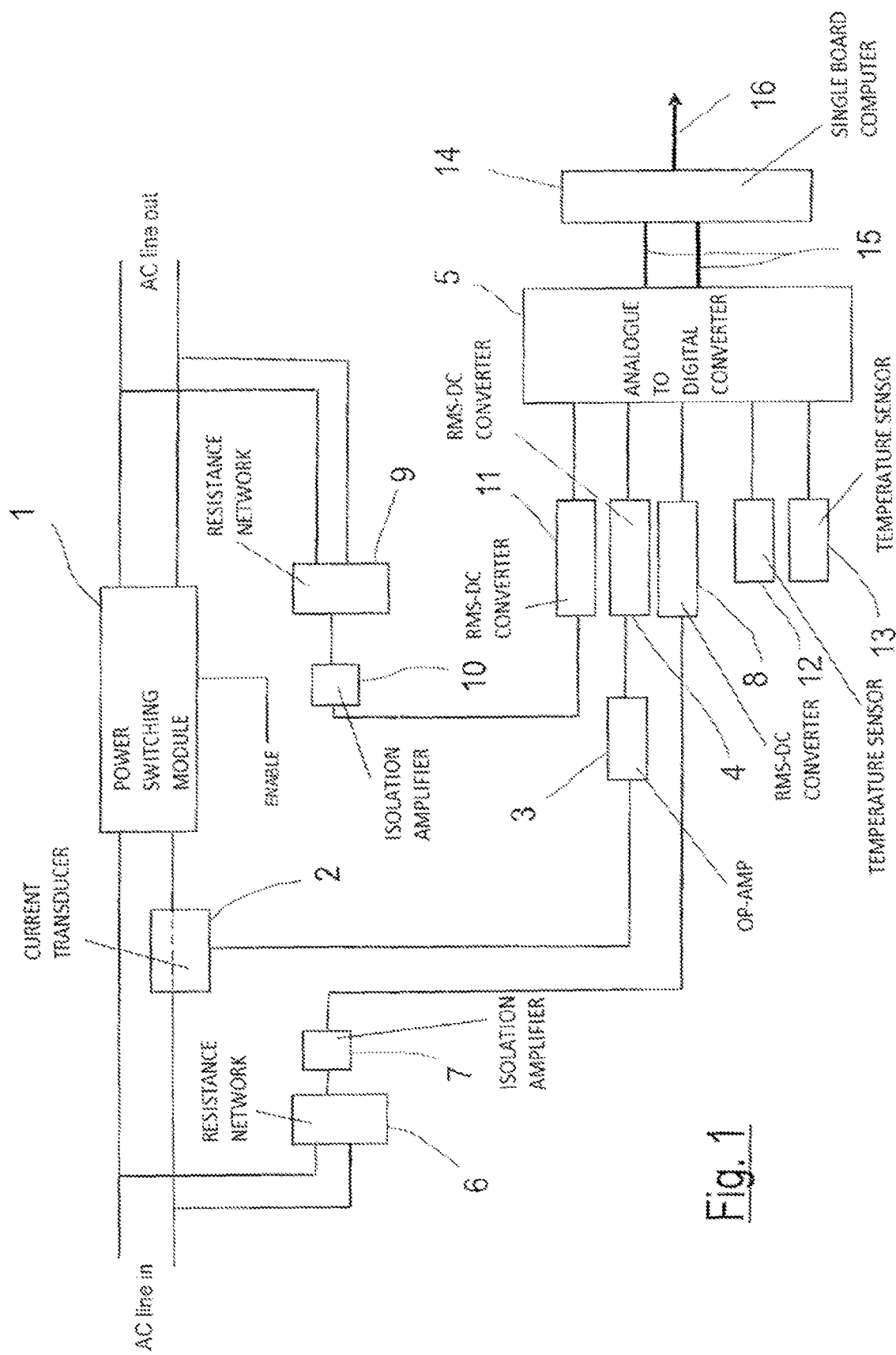
FIG. 1 schematically shows a power distribution unit in accordance with the present invention, with only one power switching module shown.

FIG. 1 schematically shows a power distribution unit in accordance with an embodiment of the present invention for use with a subsea well installation, with FIG. 2 showing a more detailed view of a portion of the unit. This unit is designed to replace a conventional power distribution and protection module, and as such shares various features in common with such a module, in particular an input adapted to receive a pair of high voltage AC power lines (shown as "AC line in") for example from the surface, e.g. a topside installation or vessel, and an output adapted for outputting high voltage AC power (shown as "AC line out") on a pair of lines to components of the underwater installation, the unit comprising an electrical power switching module 1 connected between the input and the output and being operable to switch AC power in use. Here, the AC voltages may typically be in the range of about 150V to about 600V. The power switching modules 1 themselves are well-known in the art, and therefore will not be described in detail here. When the PSM 1 is enabled, the high voltage AC is switched to the output. For simplicity, the unit shown only has connections for one AC line, and as a result only one power switching module (PSM) 1 is shown. However, units with greater numbers of lines and PSMs are common, and the present invention may be extended to these situations in a straightforward manner, as would be understood by those skilled in the art.

As will now be described, the present invention enables various operating parameters of the PSM to be measured and transmitted to the surface:

Load Current

The load current across the PSM 1 is measured using a Hall Effect current transducer 2 (also known as a close loop flux gate device), which is connected in series with one of the AC power lines. The transducer 2 is also shown in slightly more detail in FIG. 2. The AC output signal from the transducer 2 is passed to a small signal op-amp 3 for amplification, and then on to a RMS-DC converter 4, for conversion to DC using the AC current's root mean square value. The output DC current is then passed to an analogue to digital convertor 5, as will be described later.

Input Voltage

To enable measurement, the input AC voltage to the PSM 1 is scaled down by a resistance network 6, and then fed to an isolation amplifier 7. These components are shown in more detail in FIG. 2. The resistance network 6 comprises three series-connected resistors 6a, 6b and 6b connected across the input AC power lines. Since these resistances are precisely known, the voltage across resistor 6b can be correlated to the input AC voltage, and the voltage across resistor 6b is fed to the isolation amplifier 7. In this way, the high voltage AC is isolated from any low voltage electronic circuitry. The isolation amplifier 7 shown is a two-port transformer coupler isolation amplifier, types of which are available "off the shelf". The output from the isolation amplifier 7 is fed to a RMS-DC converter 8 where it is converted to DC, and the DC output signal is passed to analogue to digital converter 5.

Output Voltage

The output AC voltage from the PSM 1 may be measured in a similar manner to the input voltage as described above. The voltage is scaled down using a resistance network 9, and passed to an isolation amplifier 10. The amplified output signal is passed to a RMS-DC converter 11, and the DC output is passed to analogue to digital converter 5.

PSM Temperature

The temperature of the PSM itself is measured using a temperature sensor 12, which is mounted to, and thus senses the temperature of, the heat sink of the PSM 1. Particularly, it is mounted to the heat sink of the silicon controlled rectifier of the PSM 1 (not shown explicitly). The output signal from the sensor 12 is fed directly to analogue to digital converter 5.

Ambient Temperature

The ambient temperature within the unit enclosure, i.e. the temperature of the air surrounding the PSM, is measured by a temperature sensor 13. The output signal from the sensor 13 is fed directly to analogue to digital converter 5.

As described above, the various signals indicative of each operating parameter are each fed to an analogue to digital converter 5 and converted into digital signals. These are passed to a single board computer 14 via I²C bus lines 15. The single board computer 14 is mounted on a power switching control module card (not shown), a standard component in known power distribution and protection modules. It should be noted that if additional PSMs are used, each would be controlled by a common power switching control module card. The computer 14 converts the digital signals into a format compatible with TCP/IP, for example using the Ethernet protocol, and then transmits them, via Ethernet interface 16 to the standard well installation communications system. This enables the operating parameters to be sent to a remote location such as the surface, monitored and logged, using the existing well communications network.

Various alternatives and modifications within the scope of the invention will be apparent to those skilled in the art. For example, other transmission protocols than those explicitly described could be employed, if favoured by the operator of the installation. Other operating parameters than those listed could be measured.

What is claimed is:

1. A method of monitoring an electrical power switching module of an underwater installation, the power switching module being operable to switch AC power in use, the method comprising the steps of:
    a) measuring at least one operating parameter of the power switching module and producing a signal indicative of the measured parameter, wherein the operating parameter comprises an input voltage to the power switching module and/or an output voltage from the power switching module, wherein the voltage is scaled down using a resistance network, and wherein the voltage output from the resistance network is fed into an isolation amplifier;
    b) if the signal is not digital, then converting the signal into a digital signal; and
    c) outputting the digital signal on a bus.

2. A method according to claim 1, wherein step c) comprises outputting the signal on an inter-integrated circuit (I²C) bus.

3. A method according to claim 1, further comprising the step of:
    d) transmitting the output digital signal to a remote location using Transmission Control Protocol/Internet Control Protocol (TCP/IP).

4. A method according to claim 1, wherein the operating parameter comprises a load current across the power switching module.

5. A method according to claim 1, wherein the operating parameter comprises the temperature of the power switching module and/or the ambient temperature around the power switching module.

6. A method according to claim 1, wherein the power switching module is housed within a power distribution and protection module.

7. A power distribution unit for an underwater installation having an input adapted to receive AC power and an output adapted for outputting AC power, the unit comprising an electrical power switching module connected between the input and the output and being operable to switch AC power in use, wherein the unit further comprises:
    measuring means for measuring an operating parameter of said power switching module and producing an output signal indicative of said measured parameter, wherein the operating parameter comprises an input AC voltage to the power switching module and/or and output AC voltage from the power switching module;
    an analogue to digital converter for converting the signal indicative of the measured parameter to a digital signal;
    a bus for outputting the digital signal;

a resistance network connected to the AC connection to scale down the voltage; and an isolation amplifier connected to the resistance network to receive voltage therefrom.

8. A power distribution unit according to claim 7, wherein the bus is an inter-integrated circuit (I²C) bus.

9. A power distribution unit according to claim 7, comprising format conversion means for converting the output digital signal into Transmission Control Protocol/Internet Control Protocol (TCP/IP) format.

10. A power distribution unit according to claim 9, comprising interfacing means for passing the converted signal onto a TCP/IP network.

11. A power distribution unit according to claim 7, comprising additional measuring means for measuring additional respective operating parameters of said power switching module and producing respective output signals, and wherein each of said output signals is output by the bus.

12. A power distribution unit according to claim 7, wherein the operating parameter comprises the load current across the power switching module.

13. A power distribution unit according to claim 7, wherein the operating parameter comprises the temperature of the power switching module and/or the ambient temperature of the unit.

* * * * *